(12) United States Patent
Conrad et al.

(10) Patent No.: US 6,566,759 B1
(45) Date of Patent: May 20, 2003

(54) SELF-ALIGNED CONTACT AREAS FOR SIDEWALL IMAGE TRANSFER FORMED CONDUCTORS

(75) Inventors: Edward W. Conrad, Jeffersonville, VT (US); Chung H. Lam, Williston, VT (US); Dale W. Martin, High Park, VT (US); Edmund Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/379,453

(22) Filed: Aug. 23, 1999

(51) Int. Cl.⁷ .............................................. H01L 23/48
(52) U.S. Cl. ...................................... 257/775; 257/758
(58) Field of Search .............................. 257/773, 775, 257/758, 734; 438/666, 309, 348, 689, 694, 584, 585, 595, 596, 696; 584/597, 618, 622, 637, 639

(56) References Cited

U.S. PATENT DOCUMENTS

| | | | | |
|---|---|---|---|---|
| 4,571,559 A | * | 2/1986 | Henry et al. .................. 333/17 |
| 4,647,340 A | * | 3/1987 | Szluk et al. ................. 156/662 |
| 4,744,861 A | * | 5/1988 | Matsunaga et al. ......... 156/643 |
| 4,799,990 A | * | 1/1989 | Kerbaugh et al. .......... 156/636 |
| 4,803,173 A | | 2/1989 | Sill et al. |
| 4,808,545 A | | 2/1989 | Balasubramanyam et al. |
| 4,812,885 A | * | 3/1989 | Riemenschneider ....... 357/23.5 |
| 4,962,060 A | * | 10/1990 | Sliwa et al. ................ 437/192 |
| 5,014,103 A | * | 5/1991 | Ema .............................. 357/41 |
| 5,270,254 A | | 12/1993 | Chen et al. |
| 5,296,400 A | | 3/1994 | Park et al. |
| 5,321,211 A | * | 6/1994 | Haslam et al. .............. 174/262 |
| 5,358,884 A | * | 10/1994 | Violette ...................... 437/341 |
| 5,364,817 A | * | 11/1994 | Lur et al. .................... 437/192 |
| 5,376,817 A | * | 12/1994 | Seyyedy et al. ............. 257/374 |
| 5,410,457 A | * | 4/1995 | Parker ......................... 362/205 |
| 5,432,381 A | * | 7/1995 | Melzner ...................... 257/774 |
| 5,614,765 A | * | 3/1997 | Avanzino et al. ........... 257/774 |
| 5,639,688 A | | 6/1997 | Delgado et al. |
| 5,700,706 A | | 12/1997 | Juengling |
| 5,705,409 A | * | 1/1998 | Witek .......................... 437/35 |
| 5,756,396 A | * | 5/1998 | Lee et al. .................... 438/622 |
| 5,780,339 A | | 7/1998 | Liu et al. |
| 5,795,830 A | | 8/1998 | Cronin et al. |
| 5,898,982 A | * | 5/1999 | Metzler ...................... 29/25.42 |
| 5,904,539 A | * | 5/1999 | Hause et al. ................ 438/427 |
| 5,905,307 A | * | 5/1999 | Onoda ........................ 257/775 |
| 5,981,357 A | * | 11/1999 | Hause et al. ................ 438/427 |
| 6,025,260 A | * | 2/2000 | Lien et al. ................... 438/619 |
| 6,034,439 A | * | 3/2000 | Teng et al. .................. 257/786 |
| 6,064,119 A | * | 5/2000 | Jun et al. .................... 257/773 |
| 6,069,400 A | * | 5/2000 | Kimura et al. .............. 257/773 |
| 6,091,027 A | * | 7/2000 | Hesselbom et al. ......... 174/255 |
| 6,180,506 B1 | * | 1/2002 | Sullivan ..................... 438/618 |

* cited by examiner

Primary Examiner—David L. Talbott
Assistant Examiner—Lourdes Cruz
(74) Attorney, Agent, or Firm—McGinn & Gibb, PLLC; William D. Sabb, Esq.

(57) ABSTRACT

A structure for forming a sidewall image transfer conductor having a contact pad includes forming an insulator to include a recess, depositing a conductor around the insulator, and etching the conductor to form the sidewall image transfer conductor, wherein the conductor remains in the recess and forms the contact pad and the recess is perpendicular to the sidewall image transfer conductor.

19 Claims, 3 Drawing Sheets

PRIOR ART FIG.1B

SELF-ALIGNED CONTACT AREAS FOR SIDEWALL IMAGE TRANSFER FORMED CONDUCTORS

BACKGROUND OF THE INVENTION

1. Field of the Invention

The present invention generally relates to contacts for integrated circuit devices and more particularly to improved landing pads for contacts for self-aligned sidewall image conductors.

2. Description of the Related Art

Sidewall Image Transfer (SIT) techniques form conductors with very narrow widths or semiconductor devices with very short gate lengths without using critical photolithography. For example, a top view of a contact opening 10 for a sidewall conductor 11 is shown in FIG. 1A and cross-sectional views at different points along the same structure are shown in FIGS. 1B and 1C. More specifically, FIG. 1B is a cross-section of FIG. 1A along line A–A' and FIG. 1C is a cross-section of FIG. 1A along line B–B'.

In sidewall image transfer technology, conductive sidewalls 11 are formed adjacent an insulating mandrel 12. More specifically, the insulator 12 (such as a glass or oxide) is formed using conventional lithographic techniques including depositing and patterning. The sidewall spacer conductors 11 are formed using conventional deposition and directional etching techniques (e.g., reactive ion etching-RIE), as is well known to those ordinarily skilled in the art. More specifically, a conductor (such as metal, alloy or polysilicon) is deposited to surround and cover the insulator 12. Then, a directional etch is applied to the conductor. The directional etch removes material from horizontal surfaces at a much faster rate that it removes material from vertical surfaces, thereby leaving sidewall spacers 11, as shown in FIG. 1B. The directional etch could be, for example, a reactive ion etching process which is selective to the conductor and does not affect the insulator 12 or the underlying substrate.

The insulator 12 can be formed to have a minimum lithographic size which allows the conductive spacers 11 to be formed at sub-lithographic sizes. FIG. 1A also illustrates trim areas 13 which will eventually be removed to permit separation of the distinct conductors 11.

Openings 10 into an insulator 14 are made using standard lithographic or other similar techniques. The openings 10 will eventually be filled with a conductive material to allow contact to an upper layer of wiring which will be formed at a later processing step.

However, the contact opening 10 must be small because the sidewall conductor 11 is very narrow (e.g., possibly sub-lithographic). This makes the alignment and overlay process very difficult, which in turn decreases yield and imposes limits on the pitch of structures so formed. Therefore, there is in a need for an improved structure and system for forming contacts to sidewall image transfer conductors.

SUMMARY OF THE INVENTION

It is, therefore, an object of the present invention to provide a structure and method for forming a sidewall image transfer conductor having a contact pad that includes forming an insulator to include a recess, depositing a conductor around the insulator, and etching the conductor to form the sidewall image transfer conductor. The conductor remains in the recess and forms the contact pad. The recess is perpendicular to the sidewall image transfer conductor. The recess is formed to have a width smaller than twice a thickness of the sidewall image transfer conductor. The contact pad is formed to have a width greater than that of the sidewall image transfer conductor. The recess includes an indent and/or two outdents. The contact pad is formed to have an upper surface planar with that of the insulator and the sidewall image transfer conductor and a uniform unsloped upper surface.

Another embodiment of the invention is an integrated circuit chip that includes an insulator having a recess, a sidewall conductor positioned along the insulator, and a contact pad in the recess (the recess is perpendicular to said sidewall conductor). The recess has a width smaller than twice a thickness of the sidewall conductor. The contact pad has a width greater than that of the sidewall conductor. The recess includes an indent and/or two outdents. The contact pad has a uniform unsloped upper surface planar with that of the insulator and the sidewall conductor.

Yet another embodiment of the invention is an integrated circuit chip that includes an insulating mandrel having a linear edge and a non-linear feature along the linear edge, and a sidewall conductor positioned along the linear edge and the non-linear feature. The sidewall conductor within the non-linear feature includes a contact pad for the sidewall conductor. The non-linear feature has a width smaller than twice a thickness of the sidewall conductor. The contact pad has a width greater than that of the sidewall conductor. The non-linear feature is either a rectangular indent, two outdents, a curved indent or a wedge. The contact pad has a uniform unsloped upper surface planar with that of the insulator and the sidewall image transfer conductor.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A–1C are schematic diagrams of top and side views of conventional sidewall image transfer conductors and contact openings;

DETAILED DESCRIPTION OF PREFERRED EMBODIMENTS OF THE INVENTION

As mentioned above, in sidewall image transfer technologies, the contact opening 10 must be small because the sidewall conductor 11 is very narrow. This makes the alignment and overlay process very difficult.

Figure 1A:
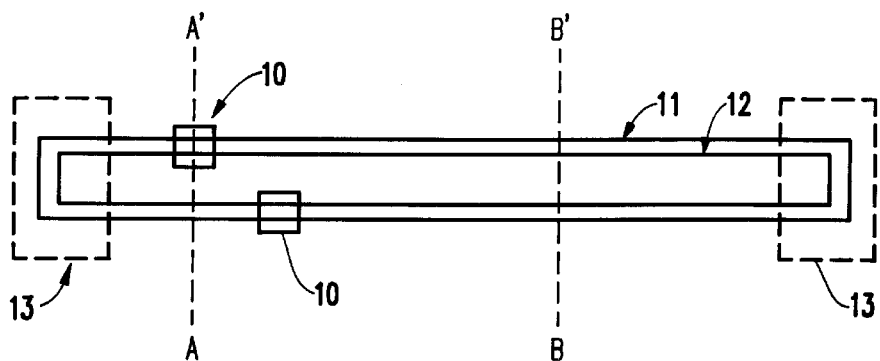
Figure 1C:
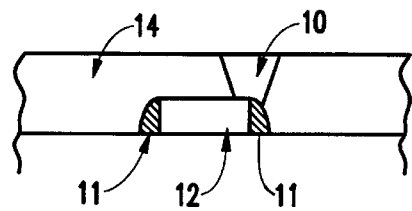
Figure 1C:
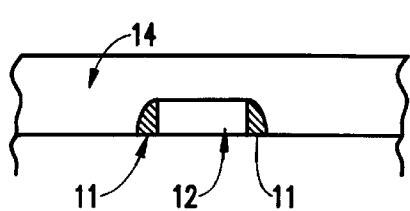
Figure 2A:
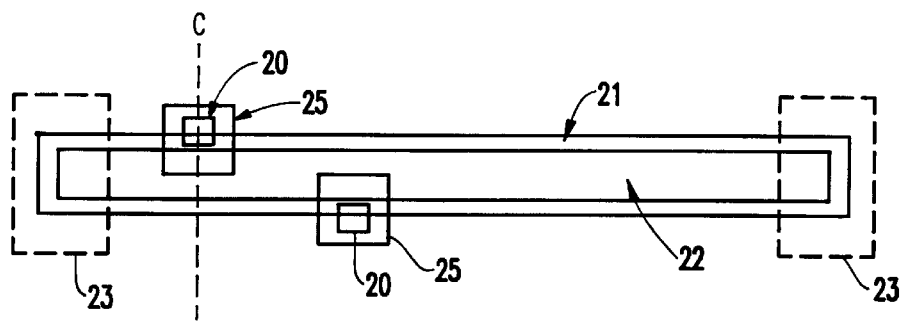
FIGS. 2A–2B are schematic diagrams of top and side views of sidewall image transfer conductors, contact openings and lithographically formed contact pads according to the invention.
Figure 2B:
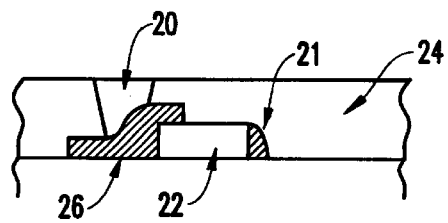

One solution to the above problem is to form a large contact pad 26 over the portion of sidewall conductor where the contact opening 20 will be formed, as shown in FIGS. 2A and 2B. More specifically, FIG. 2A illustrates sidewall conductors 21 formed along an insulator 22 in a structure which is substantially similar to the that shown in FIGS. 1A–1C. However, FIG. 2A also illustrates mask openings 25 that are used to form the contact pads 26.

The mask and openings 25 are formed using conventional methods, such as common lithographic masking techniques. The contact pads 26 are formed by depositing a conductor into the mask openings 25. The insulator 24 is then deposited and contact openings 20 are formed as discussed above, using conventional methods, such as lithography or laser oblation.

The contact pads 26 provide a larger area onto which land the contact openings 20. The relatively large area of the contact pad 26 increases the likelihood that the opening 20 will be properly aligned with the contact pad 26, which increases manufacturing yield. However, the formation of the contact pad 26 requires the additional steps associated with forming and removing the mask and with depositing the conductive material for the contact pad 26. Therefore, while the likelihood of aligning the contact opening 20 and the contact pad 26 is increased with this method, the complexity of the manufacturing process is also increased.

Further, the contact 26 itself has an irregular topography (as shown in FIG. 2B) because the contact pad 26 is formed over the corner of the insulator 22 and a portion of the conductive spacer 21. The irregular topography decreases the likelihood of forming a good electrical connection between the contact pad 26 and the conductive stud which will eventually fill the opening 20. Also, the contract pads 26 increase the overall size of the device which limits device density, increases manufacturing costs, decreases processing speed, etc.

Figure 3A:
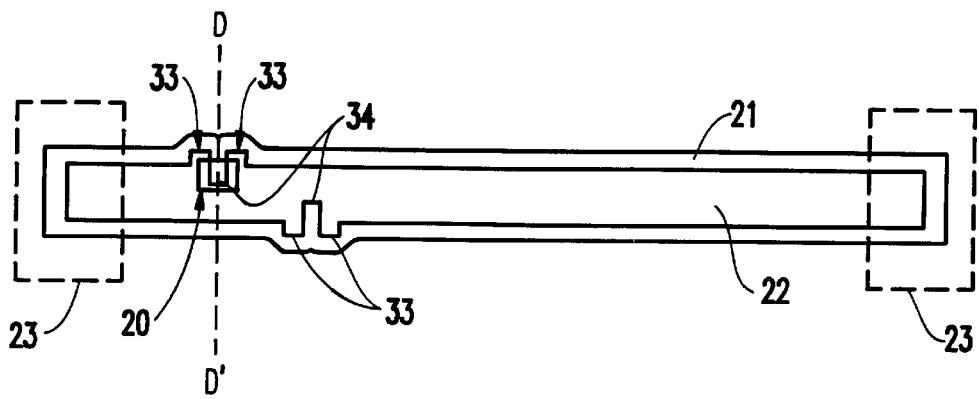
FIGS. 3A–3C are schematic diagrams of side and top views of sidewall image transfer conductors and contact openings according to the invention.
Figure 3B:
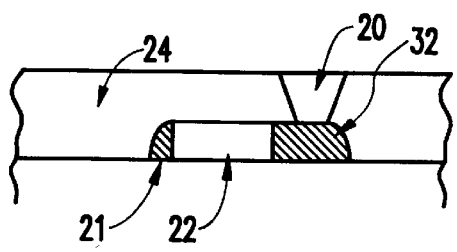
Figure 3C:
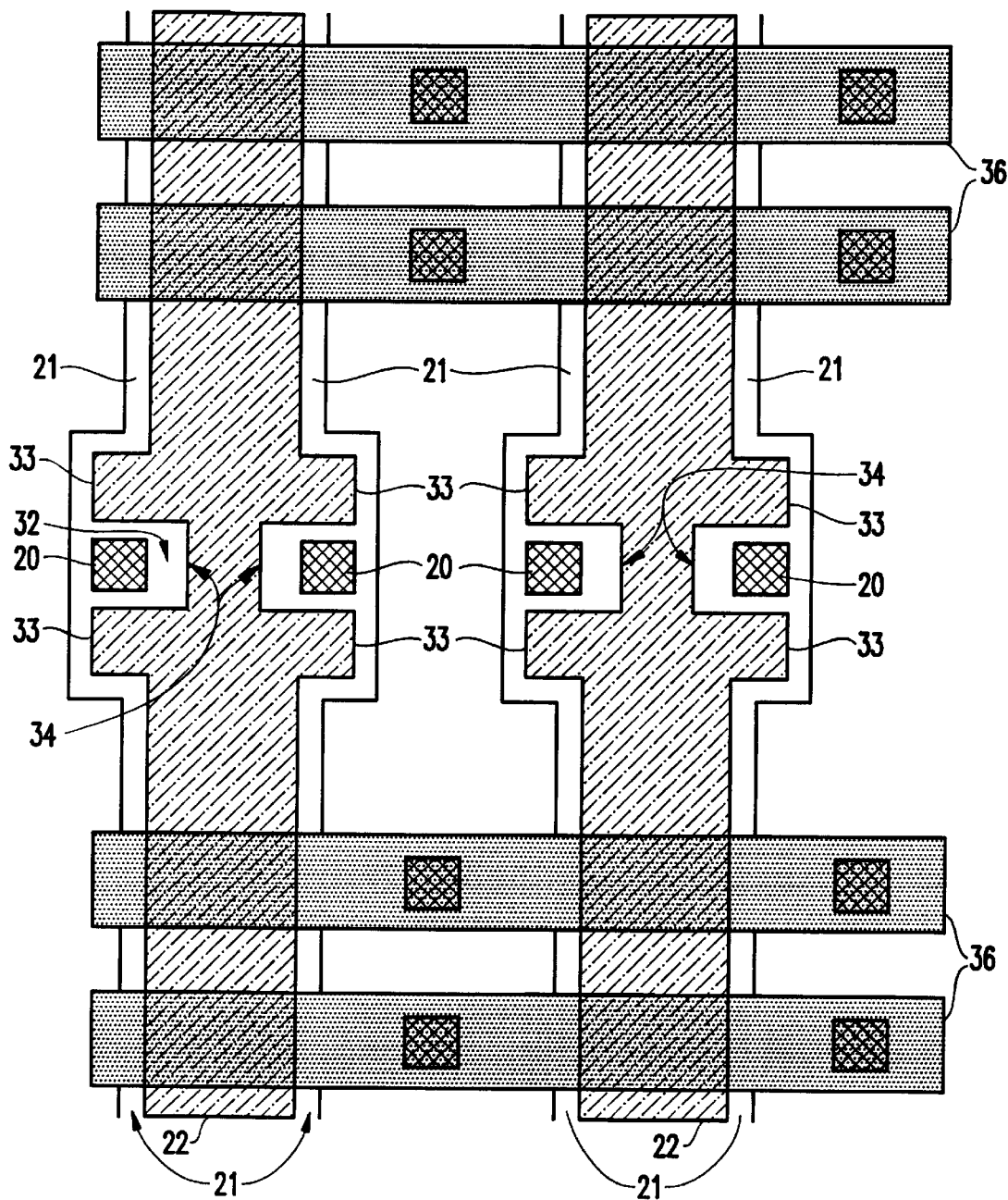

A second embodiment of the invention, shown in FIGS. 3A–3C, increases the size of the conductive spacer 21 in the area where the contact opening 20 will be formed, without the additional processing steps and chip area consumption required with the formation of the contact pads 26 discussed above.

More specifically, in this embodiment of the invention, the shape of the insulator 22 is altered in the areas where the contact openings 20 will be formed. The shape is altered to include a feature such as an indent 34 or two out-dents 33 (or both as shown in the Figures). FIG. 3C also illustrates other wiring levels 36 within the structure.

The indent 34 makes the sidewall conductor 21 substantially wider and forms a contact pad 32. More specifically, the indent 34 creates an increase in sidewall area which allows a sufficient amount of conductive spacer material to accumulate to form a contact pad 32. Therefore, during the directional etching process mentioned in the Background section, the shape of the spacer 34 allows the conductive material to remain in the indent 34, thereby forming the contact pad 32.

As shown in cross-section in FIG. 3B, the contact pad 32 of the sidewall conductor 21 is substantially larger in the area where the indent 34 is located. As with the previous embodiment, by increasing the size of the conductive spacer 21 in the contact pad 32 area, the likelihood of having the contact opening 20 aligned with the contact pad 32 is substantially increased.

Further, the invention avoids the problems associated with the previous embodiment by only altering the shape of the insulating mandrel 22. Therefore, this embodiment produces a self-aligned contact pad 32 and does not require the additional processing steps which are required to form the contact pad 26. Further, the contact pad 32 has a substantially unsloped planar topography which increases the likelihood that a good electrical connection will be made between the stud which eventually fills the opening 20 and the sidewall spacer 21.

The indent 34 is sized such that the conductor deposited over the mandrel 22 completely fills in the indented shape 34. The width of the pad 32 is preferably less than or equal to two times the sidewall conductor 21 thickness (since the indent 34 fills from both sides) to ensure that the contact pad has a substantally uniform unsloped upper surface. When the conductive sidewall etch is performed, the contact pad area 32 will form the relatively flat-topped structure 32, rather than the sloped, narrow surface of the sidewall spacer 11 (e.g., FIG. 1B) that is the natural product of this process. Since the conductor 21 is exposed to the etching rather than protected from it by a photoresist, the shape of the resulting top of the contact landing area 32 is planar or recessed relative to the top of the mandrel 22. As explained above, this flat or recessed shape increases the likelihood of a good electrical contact with the conductive stud which will fill the contact opening 20.

Figure 4:
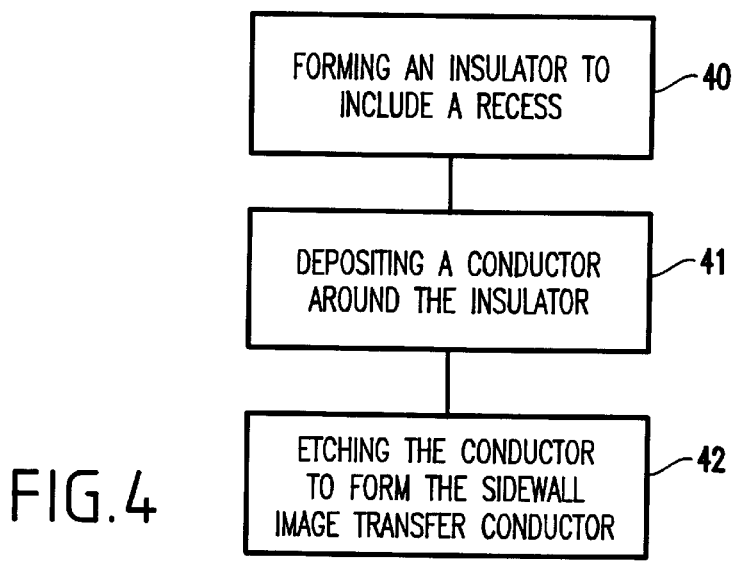
FIG. 4 is a flow diagram illustrating a preferred method of the invention.

A flowchart representation of the invention is illustrated in FIG. 4. As shown in item 40, an insulator 22 including a recess 34 is formed. In item 41, a conductor 21 is deposited around the insulator 22. In item 42, The conductor 21 is etched to form the sidewall image transfer conductor 21, wherein the conductor 21 remains in the recess 34 and forms the contact pad 32.

The foregoing example uses an indent 34 to create the contact pad 32. However, as would be known by one ordinarily skilled in the art given this disclosure, any non-linear feature on the insulating mandrel 22, such as a curved opening, a wedge, etc. could be used depending upon the specific design goals.

While the invention has been discussed above with respect to a particular mandrel 22/conductive spacer 21 combination, as would be known by one ordinarily skilled in the art given this disclosure, the invention can be used with any similar any SIT structure where an increase and flatness of contact area are important. This is especially useful with very short channel devices where SIT achieve sub-lithographic resolutions.

As shown above, the invention incorporates a special geometric feature in the mandrel used to define the gate conductors which produces a fully self-aligned feature suitable for use later as an area to land a contact.

While the invention has been described in terms of preferred embodiments, those skilled in the art will recognize that the invention can be practiced with modification within the spirit and scope of the appended claims.

What is claimed is:

1. An integrated circuit chip comprising:
    a first insulator having a recess;
    a sidewall conductor positioned along said first insulator, wherein said recess is perpendicular to said sidewall conductor;
    a contact pad in said recess; and
    a second insulator covering said sidewall conductor and insulating said sidewall conductor from surrounding structures.

2. The integrated circuit chip in claim 1, wherein said recess has a longitudinal width smaller than twice a thickness of said sidewall conductor.

3. The integrated circuit chip in claim 1, wherein said contact pad has a width greater than that of said sidewall conductor.

4. The integrated circuit chip in claim 1, wherein said recess comprises an indent.

5. The integrated circuit chip in claim 1, wherein said recess comprises two projections.

6. The integrated circuit chip in claim 1, wherein said contact pad has an upper surface planar with upper surfaces of said insulator and said sidewall conductor.

7. The integrated circuit chip in claim 1, wherein said contact pad has a uniform unsloped upper surface.

8. An integrated circuit chip comprising:

an insulating mandrel having a linear edge and a non-linear feature along said linear edge;

a sidewall conductor positioned along said linear edge and said non-linear feature, wherein said sidewall conductor within said non-linear feature comprises a contact pad for said sidewall conductor; and a second insulator covering said sidewall conductor and insulating said sidewall conductor from surrounding structures.

9. The integrated circuit chip in claim 8, wherein said non-linear feature has a longitudinal width smaller than twice a thickness of said sidewall conductor.

10. The integrated circuit chip in claim 8, wherein said contact pad has a width greater than other portions of said sidewall conductor.

11. The integrated circuit chip in claim 8, wherein said non-linear feature comprises one of a rectangular indent, two projections, a curved indent and a wedge.

12. The integrated circuit chip in claim 8, wherein said contact pad has an upper surface planar with upper surfaces of said insulator and said sidewall conductor.

13. The integrated circuit chip in claim 8, wherein said contact pad has a uniform unsloped upper surface.

14. The integrated circuit chip in claim 1, wherein said second insulator includes an opening above said contact pad.

15. The integrated circuit chip in claim 8, wherein said second insulator includes an opening above said contact pad.

16. An integrated circuit chip comprising:

an insulating mandrel having two linear edges and a non-linear feature along at least one of said linear edges;

sidewall conductors positioned along said linear edges and said non-linear feature, wherein a portion of one of said sidewall conductors within said non-linear feature comprises a contact pad for said sidewall conductor; and a second insulator covering said sidewall conductors and insulating said sidewall conductors from surrounding structures.

17. The integrated circuit chip in claim 16, wherein said second insulator covers said insulating mandrel.

18. The integrated circuit chip in claim 16, wherein said second insulator includes an opening above said contact pad.

19. The integrated circuit chip in claim 16, wherein said non-linear feature comprises one of an indent and a projection.

* * * * *